United States Patent [19]

Janko

[11] Patent Number: 4,950,981

[45] Date of Patent: Aug. 21, 1990

[54] APPARATUS FOR TESTING A CIRCUIT BOARD

[75] Inventor: Bozidar Janko, Portland, Oreg.

[73] Assignee: Tektronix, Inc., Beaverton, Oreg.

[21] Appl. No.: 338,787

[22] Filed: Apr. 14, 1989

Related U.S. Application Data

[63] Continuation-in-part of Ser. No. 338,712, Apr. 14, 1989.

[51] Int. Cl.⁵ .................. G01R 31/02; G01R 1/06
[52] U.S. Cl. .................. 324/158 F; 324/158 P
[58] Field of Search ......... 324/158 F, 158 P, 73 PC, 324/72.5; 439/482, 77

[56] References Cited

U.S. PATENT DOCUMENTS

| | | | |
|---|---|---|---|
| 3,445,770 | 5/1969 | Harmon | 324/158 P |
| 3,824,462 | 7/1974 | Vinsani | 324/158 F |
| 3,970,934 | 7/1976 | Aksu | 324/158 P |
| 4,177,425 | 12/1979 | Lenz | 324/158 P |
| 4,232,928 | 11/1980 | Wickersham | 324/158 P |
| 4,514,022 | 4/1985 | Payne | 361/386 |
| 4,647,851 | 3/1987 | Dugan | 324/158 F |
| 4,649,339 | 3/1987 | Grangroth et al. | 324/158 F |
| 4,658,330 | 4/1987 | Berg | 324/158 P |
| 4,658,331 | 4/1987 | Berg | 361/386 |
| 4,758,785 | 7/1988 | Rath | 324/158 P |
| 4,820,976 | 4/1989 | Brown | 324/158 F |

Primary Examiner—Reinhard J. Eisenzopf
Assistant Examiner—Vinh P. Nguyen
Attorney, Agent, or Firm—John Smith-Hill

[57] ABSTRACT

A probe for testing a circuit board having a plurality of test points distributed in a predetermined pattern over a main surface of the board comprises a locating member having a plurality of passages therein, the passages being distributed in a pattern corresponding substantially to the predetermined pattern. Probe elements extend in the passages respectively, the probe elements being movable independently of one another in the respective passages. Flexible conductors are connected to the probe elements. When the locating member is in confronting relationship with the main surface of the circuit board and the passages are in register with the test points and pressure is applied to the probe elements, the probe elements are brought into pressure contact with the test points.

22 Claims, 2 Drawing Sheets

APPARATUS FOR TESTING A CIRCUIT BOARD

CROSS REFERENCE TO RELATED APPLICATION

This is a continuation-in-part of co-pending application Ser. No. 07/338,712 filed Apr. 14, 1989, now co-pending.

BACKGROUND OF THE INVENTION

This invention relates to apparatus for testing a circuit board.

It is conventional to test a populated circuit board, i.e. a circuit board comprising a support member and an electronic component mounted on the support member, by connecting individual probes to the leads of the component, and using a test instrument to observe the waveforms existing at those leads. The probes are connected to the leads of the component by mechanically gripping the leads. This technique is not applicable to a component that is surface mounted on the support member, because the component does not have leads that can be readily gripped, and in any event the leads are too close together to be gripped without risk of causing a short circuit between the leads.

The co-pending application referred to above describes a probe that comprises a flexible sheet of dielectric material, contact pads on a first surface of the sheet, and conductor runs connecting the contact pads to terminals of the probe. The pattern of contact pads on the first surface of the sheet corresponds to the pattern of test points on a circuit board to be tested. In use of the probe, the flexible sheet is positioned with its first surface in confronting relationship with the circuit board and the pattern of contact pads in registration with the pattern of test points. Pressure is applied to the flexible sheet, whereby the contact pads are brought into contact with the test points respectively.

The probe described in the co-pending application referred to avoids the problems discussed above in testing a populated circuit board. However, this probe is nevertheless subject to disadvantage, in that it is not suitable for testing a circuit board when the test point is close to a component that is substantially higher than the test point, since engagement of the flexible sheet with the component interferes with reliable contact being established between the contact pad of the probe and the test point in the board.

Co-pending application Ser. No. 07/338,786 filed Apr. 14, 1989 describes a probe that is suitable for testing a populated circuit board and comprises a sheet of dielectric material having an opening therein sized and shaped to receive an electronic component mounted on the support member of the circuit board. The probe also comprises a contact pad exposed at a first main face of the sheet, and a conductor run connecting the contact pad to a terminal of the probe. The probe is positioned with its first main face in confronting relationship with the major surface of the support member, with the electronic component received in the opening in the sheet of dielectric material, and pressure is applied to the probe, whereby the contact pad contacts the test point. This probe avoids the above-mentioned disadvantage of the probe described in the first co-pending application referred to above, but is nevertheless subject to disadvantage in that it is not well suited for probing test points that are close together, because there is a danger that the contact pad will bridge two adjacent test points and cause a short circuit.

In the probe described in the second co-pending application referred to above, the opening in the sheet of dielectric material assists in locating the probe relative to the support member of the circuit board. The efficiency with which the hole locates the probe depends in part upon the shape of the electronic component. If the shape of the component is such that, with normal manufacturing, the probe is able to shift slightly relative to the electronic component, the risk of the test points' being short circuited is substantially increased.

SUMMARY OF THE INVENTION

A preferred embodiment of the invention in a first aspect is a probe for testing a circuit board having a plurality of test points distributed in a predetermined pattern over a main surface of the board. The probe comprises a locating member having a plurality of passages therein, the passages being distributed in a pattern corresponding substantially to the predetermined pattern. Probe elements extend in the passages respectively, the probe elements being movable independently of one another in the respective passages. Flexible conductors are connected to the probe elements. When the locating member is in confronting relationship with the main surface of the circuit board and the passages are in register with the test points and pressure is applied to the probe elements, the probe elements are brought into pressure contact with the test points.

A preferred embodiment of the present invention in a second aspect is the combination of a circuit board having a plurality of test points distributed in a predetermined pattern over a main surface thereof, and apparatus for testing the circuit board. The apparatus comprises a locating member having a plurality of passages therein, the passages being distributed in a pattern corresponding substantially to the predetermined pattern. Probe elements extend in the passages respectively, the probe elements being movable independently of one another in the respective passages. Flexible conductors are connected to the probe elements. The apparatus also comprises means for applying pressure to the probe elements when the locating member is positioned in confronting relationship with the main surface of the circuit board and the passages are in register with the test points, whereby the probe elements are brought into contact with the test points respectively.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
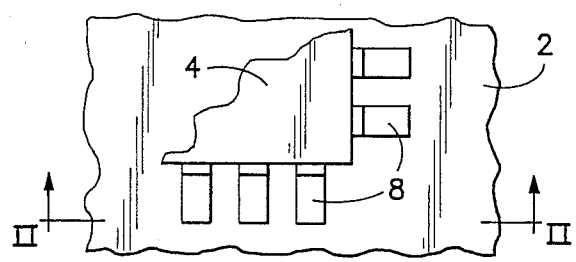
FIG. 1 is a partial top plan view of a populated circuit board.
Figure 2:
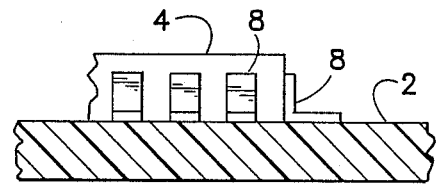
FIG. 2 is a sectional view taken on the line II—II of FIG. 1.
Figure 3:
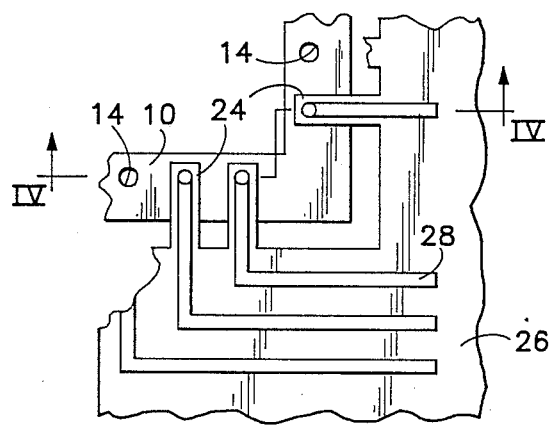
FIG. 3 is a partial top plan view of a first probe embodying the invention in its first aspect.
Figure 4:
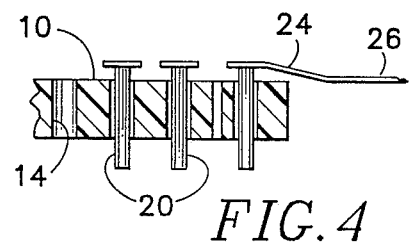
FIG. 4 is a sectional view taken on the line IV—IV of FIG. 3.

The circuit board shown in FIGS. 1 and 2 comprises a support member 2 and a packaged integrated circuit 4 mounted on the upper surface of the support member. The integrated circuit (IC) is mounted on the support member by surface mount technology, and therefore is not provided with a bulky socket and a receptacle. The IC package is relatively slim, and has multiple contact leads 8 projecting therefrom and soldered directly to contact pads (not shown) on the support member. The contact leads are disposed in a predetermined pattern around the IC package.

Figure 5:
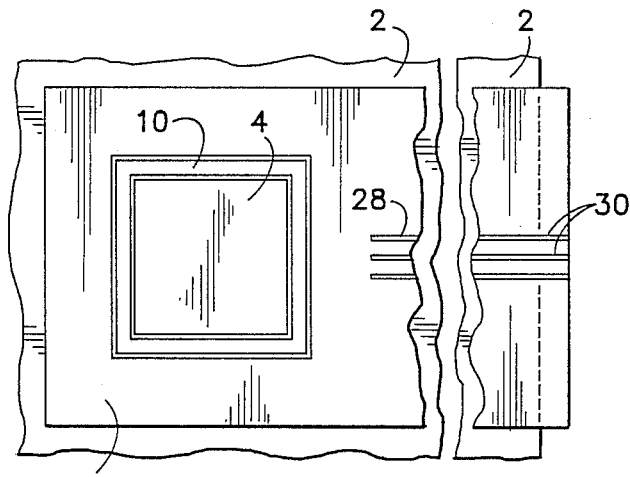
FIG. 5 is a simplified top plan view of the circuit board and the probe fitted thereto drawn to a reduced scale.
Figure 6:
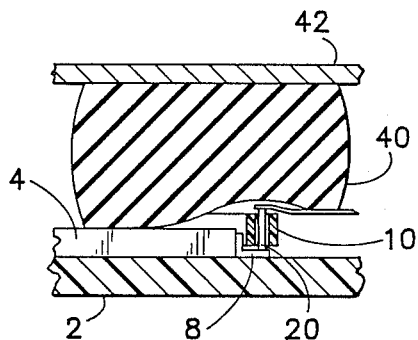
FIG. 6 is a sectional view illustrating application of the probe to the circuit board.

The probe shown in FIGS. 3–6 is designed for use in testing the circuit board shown in FIGS. 1 and 2 by probing leads 8 of IC 4. The probe comprises a locating frame 10 of rigid dielectric material. As shown in FIG. 5, locating frame 10 is rectangular in plan, so that it fits over IC 4. The frame is formed with holes 14 (not shown in FIG. 5) which register with the contact leads of the IC when the frame is fitted over the IC. Pins 20 extend within the holes respectively. At their upper ends, pins 20 extend through respective fingers 24 of a sheet 26 of flexible dielectric material, such as polyimide. Sheet 26 has conductor runs 28 on its upper surface extending from terminals 30 at an edge of the probe to the fingers. Pins 20 are soldered at their upper ends to runs 28 respectively. Runs 28 thus provide electrical connection between pins 26 and terminals 30. An edge connector (not shown) may be applied to the sheet 26 for connecting the terminals 30 to a test instrument.

The pins are a loose sliding fit in the holes in the frame, and by use of the separate fingers the pins are allowed to move independently of one another in their holes in the frame.

In order to test the circuit board, the frame is fitted over the IC (FIG. 5). A plate 42 (FIG. 6) carrying a body 40 of resilient material is placed over the probe and is positioned so that body 40 is at least partially compressed and applies pressure to the pins. Thus, the pins are bought into reliable pressure contact with the contact leads, and the voltage waveform present at a lead of the IC can be observed using a test instrument.

The probe shown in FIGS. 3–6 is not suitable if the corners of the IC package are rounded and a slight amount of relative movement is permitted between the frame and the package when the frame is fitted over the package, particularly for leads that are very closely spaced, because there is then a possibility that the pins will not contact the leads. This disadvantage is avoided in the case of the probe shown in FIG. 7, in which the frame has a comb-like configuration around its inner periphery. When the locating frame is fitted over the IC package, teeth 44 of the comb are inserted between adjacent leads, and the locating frame is accurately positioned relative to leads 8 by virtue of the cooperation between the teeth and the leads. The pins extend in the grooves defined between the teeth, rather than through bores in the locating frame.

Figure 7:
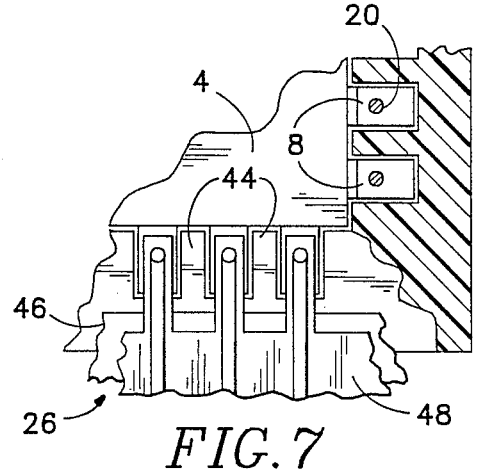
FIG. 7 is a partial plan view, partly in section, illustrating use of a second probe embodying the invention in its first aspect.

It is, of course, necessary to ensure that the locating frame remains attached to sheet 26. This may be accomplished by slightly bending the lower ends of the pins. Alternatively, as shown in FIG. 7, sheet 26 may be composed of two plies that are laminated together except near the locating frame. The lower ply 46 is attached to locating frame 10 and fingers 24 are formed in the upper ply 48. In this manner, movement of pins 20 relative to each other and to frame 10 is permitted.

It will be appreciated that the invention is not restricted to the particular embodiments that have been described, and that variations may be made therein without departing from the scope of the invention as defined in the appended claims and equivalents thereof. For example, similarly to the case of the probe described in the first co-pending application referred to above, an attenuator block may be provided in each conductor run close to the probe pin.

I claim:

1. Apparatus for testing a circuit board having a plurality of test points distributed in a predetermined pattern at a main surface of the board, the apparatus comprising a locating member having a plurality of passages therein, the passages being distributed in a pattern corresponding substantially to said predetermined pattern, probe elements extending in said passages respectively, said probe elements being movable independently of one another in the respective passages, a flexible sheet of dielectric material to which the probe elements are attached, conductor runs adhered to the flexible sheet of dielectric material and connected to said probe elements respectively, and means for applying pressure to the flexible sheet of dielectric material when the locating member is in confronting relationship with the main surface of the circuit board and the passages are in register with the test points, whereby the flexible sheet of dielectric material is deflected and the probe elements are brought into pressure contact with the test points respectively.

2. Apparatus according to claim 1, wherein the locating member is in the form of a generally rectangular frame and the passages are spaced apart along the sides of the frame, whereby the probe elements can be used to contact test points distributed about a rectangular electronic component.

3. Apparatus according to claim 1, wherein the passages are bores extending through the locating member.

4. Apparatus according to claim 1, wherein the passages are grooves at an edge of the locating member.

5. Apparatus according to claim 1, wherein the flexible sheet of dielectric material has multiple discrete fingers attached to the probe elements respectively.

6. Apparatus according to claim 5, wherein the conductor runs extend along the fingers respectively.

7. Apparatus according to claim 1, wherein the flexible sheet of dielectric material is attached to the locating member.

8. Apparatus according to claim 1, wherein the probe elements are rod like.

9. Apparatus according to claim 8, wherein the rod like probe elements extend substantially parallel to each other.

10. Apparatus according to claim 1, wherein the flexible sheet of dielectric material comprises first and second plies, the first ply being attached to the locating member and being attached to the second ply at locations spaced from the locating member and being movable relative to the second ply at locations close to the locating member, and the second ply comprising multiple discrete fingers to which the probe elements are respectively attached.

11. Apparatus according to claim 10, wherein the conductor runs extend along the fingers respectively.

12. In combination, a circuit board having a plurality of test points exposed in a predetermined pattern at a main surface thereof, and apparatus for testing the circuit board, the apparatus comprising a locating member having a plurality of passages therein, the passages being distributed in a pattern corresponding substantially to said predetermined pattern, probe elements extending in said passages respectively, said probe elements being movable independently of one another in the respective passages, a flexible sheet of dielectric material to which the probe elements are attached, conductor runs adhered to the flexible sheet of dielectric material and connected to said probe elements respectively, and means for applying pressure to the flexible sheet of dielectric material when the locating member is positioned in confronting relationship with the circuit board and the passages are in register with the test points, to deflect the flexible sheet of dielectric material and bring the probe elements into contact with the test points.

13. A combination according to claim 12, wherein the flexible sheet of dielectric material includes multiple discrete finger portions to which the probe elements are respectively attached.

14. A combination according to claim 13, wherein the conductor runs extend along the fingers respectively.

15. A combination according to claim 12, wherein the flexible sheet of dielectric material is attached to the locating member.

16. A combination according to claim 12, wherein the flexible sheet of dielectric material comprises first and second plies, the first ply being attached to the locating member and being attached to the second ply at locations spaced from the locating member and being movable relative to the second ply at locations close to the locating member, and the second ply comprising multiple discrete fingers to which the probe elements are respectively attached.

17. A combination according to claim 16, wherein the conductor runs extend along the fingers respectively.

18. A combination according to claim 12, wherein the locating member is in the form of a generally rectangular frame and the passages are spaced apart along the sides of the frame, whereby the probe elements can be used to contact test points distributed about a rectangular electronic component mounted on the circuit board.

19. A combination according to claim 12, wherein the passages are bores extending through the locating member.

20. A combination according to claim 12, wherein the passages are grooves at an edge of the locating member.

21. A combination according to claim 12, wherein the probe elements are rod like.

22. A combination according to claim 21, wherein the probe elements each have first and second ends and the first and second ends of each probe element lie on a line extending substantially perpendicular to the general plane of the circuit board.

* * * * *